United States Patent [19]

Reynolds

[11] Patent Number: 4,498,009
[45] Date of Patent: Feb. 5, 1985

[54] OPTICAL LITHOGRAPHIC SYSTEM HAVING A DYNAMIC COHERENT OPTICAL SYSTEM

[75] Inventor: George O. Reynolds, Waban, Mass.

[73] Assignee: Honeywell Inc., Minneapolis, Minn.

[21] Appl. No.: 421,625

[22] Filed: Sep. 22, 1982

[51] Int. Cl.³ .......................... B23K 9/00; H01L 21/26
[52] U.S. Cl. .................................................. 250/452.1
[58] Field of Search ................. 250/492.1; 219/219 L, 219/219 LA, 219 LP, 121 LQ; 350/162.1 L

[56] References Cited
U.S. PATENT DOCUMENTS

| | | | |
|---|---|---|---|
| 3,154,371 | 10/1964 | Johnson | 219/121 LA |
| 3,770,340 | 11/1973 | Cronin et al. | 350/162.12 |
| 3,947,093 | 3/1976 | Goshima | 219/121 L |
| 4,128,752 | 12/1978 | Gravel | 219/121 LP |
| 4,151,008 | 4/1979 | Kirkpatrick | 250/492.1 |
| 4,315,130 | 2/1982 | Inagaki et al. | 219/121 LA |

Primary Examiner—Bruce C. Anderson
Attorney, Agent, or Firm—John S. Solakian; Laurence J. Marhoefer

[57] ABSTRACT

An optical lithographic system for exposing small linewidths on integrated circuit substrates. The system comprises a deep ultraviolet (UV) source of illumination in conjunction with a dynamic coherent condenser system and an optical projection system and a deep UV sensitive photoresist.

6 Claims, 11 Drawing Figures

OPTICAL LITHOGRAPHIC SYSTEM HAVING A DYNAMIC COHERENT OPTICAL SYSTEM

BACKGROUND OF THE INVENTION

The present invention relates to high resolution optical lithographic systems, and, more particularly, those used in the fabrication of integrated circuits.

The fabrication of very high density integrated circuits ("IC's") is dependent upon the availability of high resolution lithographic systems capable of resolving and exposing the narrow circuit linewidths onto the photoresist masks used during the manufacturing process. At present, there are several different designs for optical lithographic systems capable of producing a minimum linewidth resolution of about one (1) micron, i.e., one micrometer. Currently, the IC industry is seeking a production worthy means of exposing 0.5 micron linewidths to reduce electronic component size as required by high technology applications.

One optical lithographic design utilizes a reflective optical (1:1 projection ratio) projection system to image a narrow arc of the desired mask image onto the circuit substrate wafer and photoresist. As the system simultaneously scans the mask image and object (wafer) planes, a two dimensional image of the mask is exposed on the photoresist coated on the circuit wafer. This sytem, which is designed to maintain a constant optical pathlength between mask image and wafer surface, is subject to inaccuracies caused by small variations in wafer thickness, as well as variations in flatness of the wafer, wafer holder, mask and reflective optics. These mechanical problems, coupled with the difficulty of producing accurate 1:1 masks and diffraction problems associated with imaging these narrow lines, have limited the resolution of these 1:1 lithographic printers to approximately 2.0 microns. Production linewidths of 1.25 microns are achieved in these systems by using short wavelength ultraviolet sources (330 nanometers (nm)). Ultimately, the performance of this system design is limited by accumulated mechanical positioning errors and diffraction problems.

Another optical lithographic system design utilizes a reduction ratio in the projection optics (commonly 10:1), and a precise mechanical stage controlled by a laser interferometer to replicate an enlarged mask on the photoresist and wafer surface. This system relieves mask fabrication limitations of the 1:1 system, minimizes mechanical positioning errors, and reduces the errors caused by diffraction problems. Since the field of view of this optical system is smaller than the corresponding 1:1 system,, linewidths as fine as 0.75 micron are possible and have been demonstrated in the laboratory. Production linewidths between 1.0 and 1.25 microns are claimed.

As an alternative, electron-beam lithographic systems have been developed which are capable of resolving 0.1 micron linewidths. However, these systems have several disadvantages which would make them undesirable if an optical system capable of 0.5 micron resolution was available. First, the use of the electron-beam systems require that the wafer or photoresist be placed in a vacuum during exposure. As a result, the cycle time for creating each IC increases, since, for each circuit layer, the wafer must be placed in the system, the system evacuated, the vacuum brought down and the wafer exposed and then replaced in the system. Contamination becomes a problem because of the increased handling of the wafer during IC fabrication. In addition, the costs of electron-beam systems are excessive in comparison to high resolution optical lithographic systems.

It is accordingly a primary object of the present invention to provide an improved high resolution optical lithographic system having a dynamic coherent optical system.

SUMMARY OF THE INVENTION

The above and other objects of the present invention are achieved by providing an illumination system utilizing a deep ultraviolet ("UV") source in conjunction with a high reduction ratio (e.g., 10:1) reflective optical system, a fine focus sensor, and a UV sensitive photoresist material. In an alternate embodiment, a refractive optical system with a high reduction ratio replaces the reflective projection system.

Since the maximum theoretical resolution of an optical system is directly related to the wavelength of the illumination source, the simplest way to increase resolution is to lower the wavelength of the source. The use of a reflective system removes all source wavelength restrictions and eliminates chromatic aberrations such that the lowest wavelength source can be used where matching photoresists are available. Current 1:1 reflective systems utilize near UV sources, but have been limited by mechanical positioning errors.

In the present invention, a very deep UV source (200 to 250 nm), for example, either an Excimer $NF_3$, Argon or Krypton laser or a suitable lamp source, such as an arc lamp, is used to expose the mask pattern on a UV-sensitive photoresist/IC surface. A dynamic coherent optical condenser system is used to increase the system resolution and contrast (as measured by the Modulus Transfer Function, or "MTF"). A dynamic coherent optical condenser system is described by Cronin, Pinard and Smith in U. S. Pat. No. 3,770,340 and by D. J. Cronin and A. E. Smith in an article entitled "Dynamic Coherent Optical System", Optical Engineering magazine, Volume 12, at page 50, March/April, 1973. This increased contrast is significant, first, because most photoresists require sixty percent (60%) image modulation to record the exposure, and second, because it allows a reduction in the numerical aperture of the lens, thereby decreasing cost and lens design complexity.

Similar improvements in resolution and contrast may be obtained by using an annular reflective element with central obscuration in combination with an annular dynamic coherent imaging system. An annular dynamic coherent source may be obtained by utilizing a spinning prism or mirror, a coupled pair of accusto-optic modulators tuned to cause circular motion of the focused laser spot, or multiplexed holograms in combination with the desired laser source. A fourth approach, utilizing an annular fiber optic bundle to create a condenser equivalent to the dynamic coherent annular source may be used. This condenser has an advantage in that it is relatively inexpensive, and that it has no moving parts, and thus creates no mechanical vibrations which might affect the focus or alignment subsystems.

To maintain the contrast and resolution requirements, the depth of focus and focus accuracy must be matched to the operating wavelength and numerical aperture of the system. Current commercial optical lithographic systems utilize various types of focal sensors (pneumatic, intensity profiling, focus wedge or "fly's" eye lens) to achieve focal accuracies of ±0.25 microns. To achieve 0.5 microns resolution on the photoresist, focal accuracies between 300 and 2000 angstroms are required. The present invention may use a three-slit interferometric focal sensor to overcome prior focus accuracy limitations. This type of device is more accurate since it works on the principle of amplitude modulation rather than detection of interferometric fringe shifts.

To insure proper registration of successive exposures of the mask and IC, the system must be aligned to within ten percent (10%) of the desired linewidth, approximately ±0.05 microns. Although current production systems are only capable of alignment accuracies on the order of 0.25 microns, research systems using laser interferometric or intensity profiling and image processing techniques have demonstrated alignment precision of ±0.025 microns.

BRIEF DESCRIPTION OF THE DRAWINGS

The above and other objects of the present invention are achieved in the illustrative embodiment as described with respect to the Figures in which.

DETAILED DESCRIPTION OF THE PREFERRED EMBODIMENT(S)

Figure 1A:
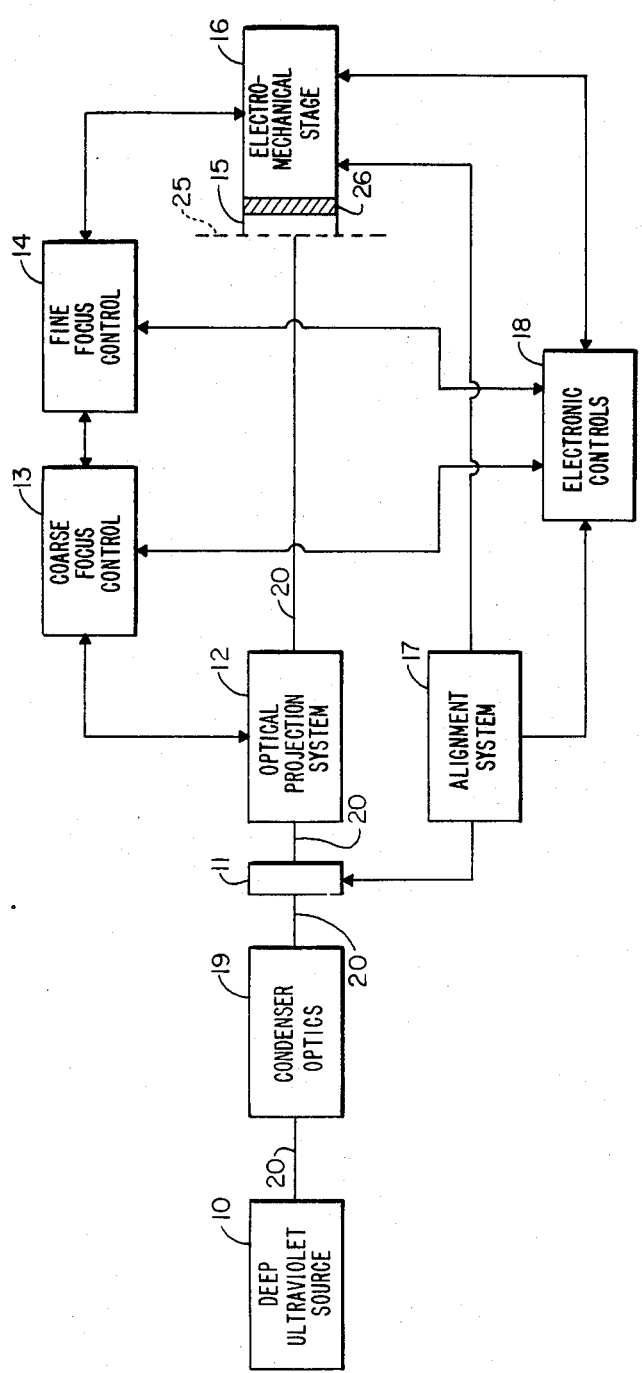
FIG. 1A shows a block diagram of the optical imaging system with indirect focus control and FIG. 1B shows a block diagram of a through-the-lens focus control device for use in the system of FIG. 1A.

Referring to FIG. 1A, the photolithographic system of the present invention includes a deep UV illumination source 10 in combination with dynamic coherent condenser optics 19, a circuit design mask 11, optical projection system 12, coarse focus control 13, fine focus control or sensor 14, an IC wafer 26 with UV sensitive photoresist 15, an electromechanical stage 16 which holds wafer 26, an alignment system 17, and an electronic control unit 18. Dotted line 25 designates the image plane.

In one application, the described components are selected such that the operational photolithographic system is capable of exposing, for example, approximately sixty (60) wafer levels per hour on a 4-inch diameter IC wafer 26. The image field of projection lens 21 is approximately ten (10) millimeters by ten (10) millimeters square so that one hundred (100) separate exposures are required for each wafer level. In such exemplary system, each exposure requires approximately 0.25 seconds, including positioning, focus, alignment, and exposure time.

The illumination source 10 is a deep UV source, either a laser or arc lamp. Any deep UV source capable of producing enough power to trigger the photoresist mechanism at the plane of photoresist 15 in less than a 0.25 second period may be used. As an example, source 10 might comprise a cadmium arc lamp with appropriate filters, or an Excimer $NF_3$(248 nm), Argon (231 nm), Krypton (219 nm) or Argon Floride (193 nm) laser.

Figure 2A:
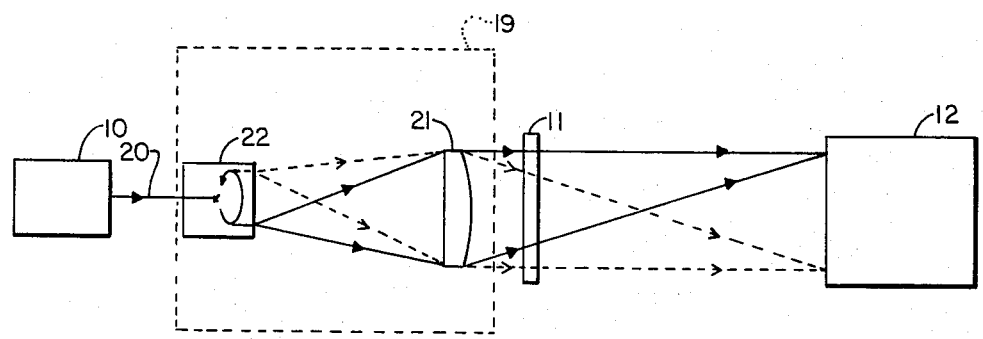
FIG. 2A shows a schematic of a dynamic coherent optical condensing system.
Figure 2B:
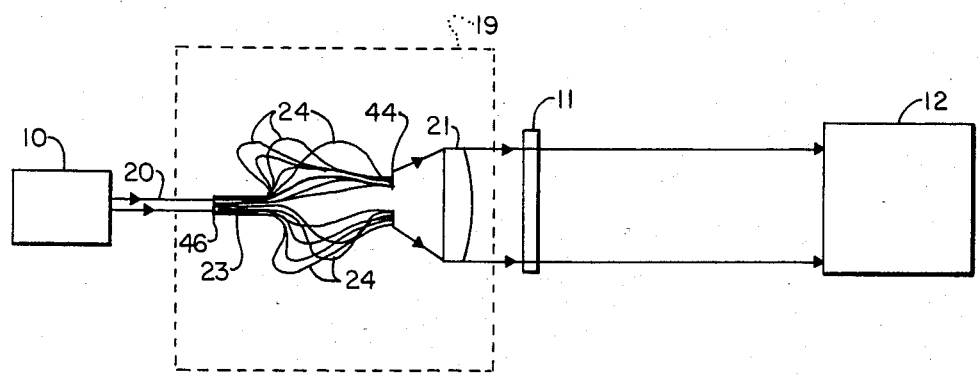
FIG. 2B shows an equivalent annular fiber optic condensing system.

A dynamic coherent optical condenser 19, or its equivalent shown in FIGS. 2A and 2B, is used to reduce edge ringing, speckle and interference typical of coherent imaging systems, while providing increased contrast and resolution, as well as a high cut-off frequency typical of incoherent imaging systems. This significant increase in contrast and resolution allows approximately a thirty percent (30%) decrease in numerical aperture of the optical system, which reduces the design complexity and cost of the optical system. This reduction in numerical aperture increases the working depth of field of the system.

Typically, a dynamic coherent condenser comprises a coherent source at the focal point of a condenser which will illuminate the optical system. The coherent beam is rotated about the edge of the pupil of the condenser optics, either by physically rotating the source, or by rotating a prism about the optic axis which deviates the beam in the desired manner. As shown in FIG. 2A, a preferred design of condenser optics 19 comprises the coherent beam 20 from deep UV source 10, in combination with the condensing optical element 21 and preferably a static device 22 for deviating beam 20 around the pupil edge of element 21. The static device for deviating beam 20 is required to eliminate vibration which might disrupt system alignment and focus subsystems. For example, device 22 might comprise two (2) orthogonally oriented acoustic-optic crystals.

As described in the article by Cronin, DeVelis and Reynolds, entitled "Equivalence of Annular Source and Dynamic Coherent Phase Contrast Viewing Systems", Optical Engineering magazine, Volume 15, No. 3, at page 276, May/June, 1976, an incoherently illuminated annulus provides the same performance improvements as the coherent condenser designs described above. In an alternate embodiment, as shown in FIG. 2B, condenser optics 19 comprises a coherent beam 20 from deep UV source 10, a fiber optic bundle 23 of individual fibers 24 and a condenser element 21.

Figure 2C:
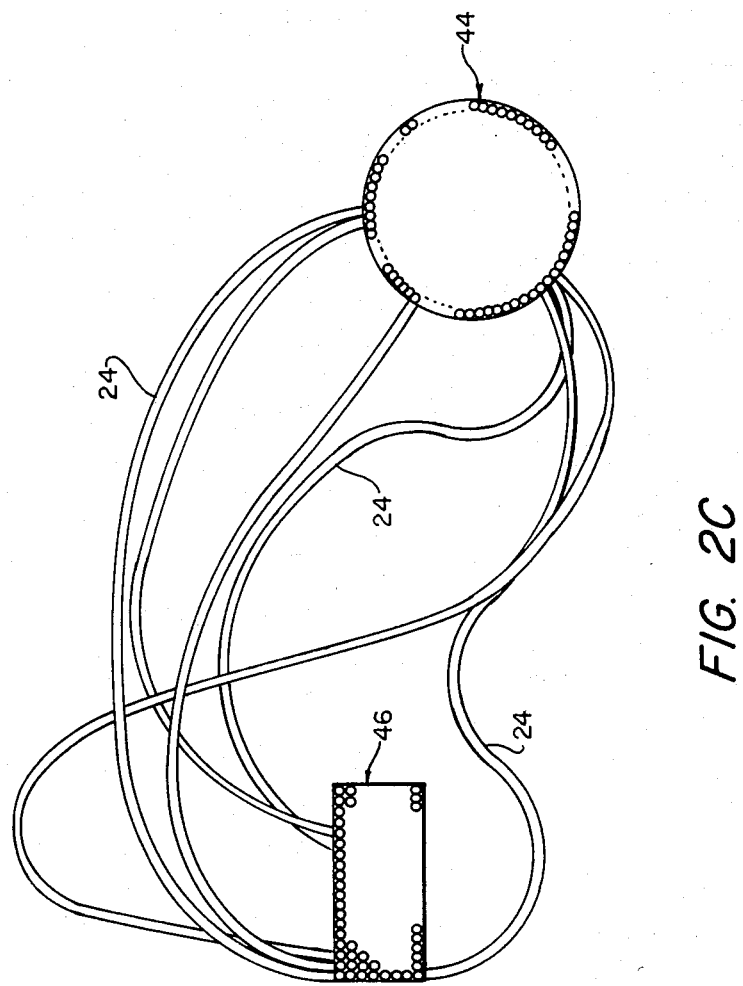
FIG. 2C shows an example of the fiber optic assembly of such condensing system.

The fiber optic bundle 23 reshapes beam 20 from a Guassian to an annular distribution at location 44, which illuminates the pupil edge of condenser element 21. The bundle 23 is bonded to match the shape of beam 20 received at location 46, and is coated to reduce reflections, as required. Lengths of individual fibers 24 are randomized to destroy temporal coherence within the bundle, thereby creating the same effect as a dynamic coherent condenser. An example of such fiber optic assembly is shown in FIG. 2C. By way of example, the assembly is designed to receive a rectangular output (such as, for example, from an Excimer $NF_3$ laser), which is converted to an annular output at location 44. It should be noted that the fibers 24 may be more closely packed at location 46 than that placement shown in FIG. 2C so that light throughput may be maximized.

The shaped beam 20 from condenser element 21 illuminates circuit design mask 11. Mask 11 comprises a transparent positive image of the desired pattern to be lithographically printed on IC wafer 26; scaled to match the reduction ratio of the projection optics 12. A typical mask includes a quartz substrate with an opaque representation of the desired circuit design pattern. The image of mask 11 is projected via optical system 12 onto photoresist surface 15 of IC wafer 26.

Figure 3A:
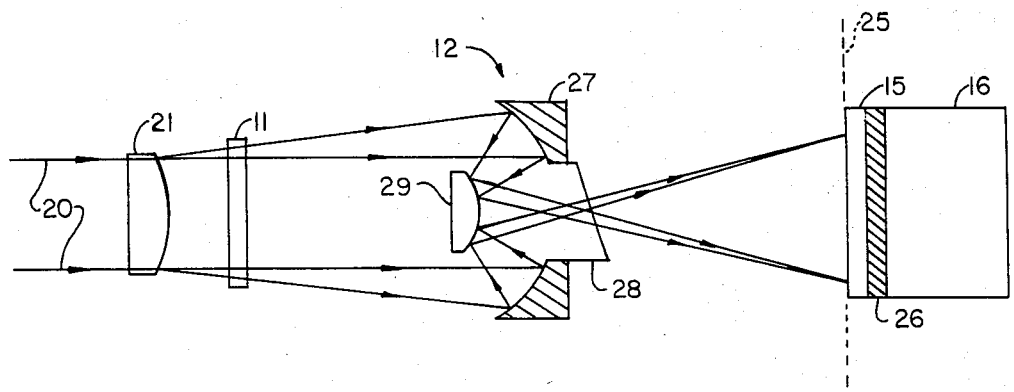
FIGS. 3A and 3B show schematic views of reflective and refractive optical projection systems, respectively.
Figure 5:
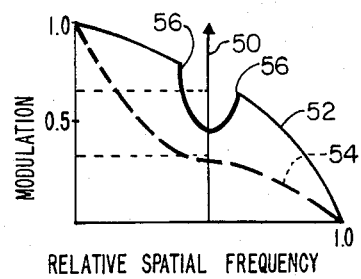
FIG. 5 shows the improvement in modulation transfer function which results from use of a dynamic coherent condenser in combination with a Cassagrain-type reflective optical system design of the subject invention.

In one embodiment, as shown in FIG. 3A, optical system 12 is a reflective telescope comprising a primary focusing mirror 27 with central obscuration 28, and secondary element 29. As described above, the enhanced MTF provided by the dynamic coherent condenser 19 can be used to great advantage in a lithographic system where the desired linewidth limit (0.25 microns to 0.5 microns) occurs at one-third the cut-off frequency of the optical system (at approximately the sixty percent (60%) contrast level). The relative enhancement of the MTF is greatest when a dynamic coherent condenser is used in combination with a Cassagrain-type reflective optical system, as shown in FIG. 3A. Reflective designs also have the advantage that design complexity is reduced because of the absence of optical aberrations typical of refractive systems.

Where the linewidth design is tuned to approximately one-third the cut-off frequency to achieve fifty to sixty percent (50–60%) contrast at image plane 25, the optimum improvement in MTF is obtained in a reflective optical system where the diameter of the central obscuration 28 is less than one-third the diameter of primary focusing mirror 27. Expressed in an alternate form; optimum reflective optical system performance occurs when:

$$\frac{V}{3} < \left(\frac{V}{2} - \frac{e}{2}\right), \text{ or } e < \frac{V}{3} ;$$

where V is the normalized cut-off frequency of the optical system and e is the ratio of the obscuration diameter to the clear aperture diameter of mirror 27. FIG. 5 shows the improvement in MTF for a system in which the diameter of central obscuration 28 is one-third the diameter of focusing mirror 27. Line 54 shows the theoretical MTF of a Cassagrain-type reflective optical system which does not incorporate a dynamic coherent condenser system. Line 52 shows the MTF of the same optical system in combination with a dynamic coherent condenser system. Inflection points 56 on line 52 occur at a relative spatial frequency of 0.5 ±e/2, in this example, at relative spatial frequencies of 0.35 and 0.65.

In the subject invention, the numerical aperture (NA) of the system 12 is approximately 0.2 to 0.4, with a 10:1 reduction ratio between mask 11 and image plane 25. The system will project 0.25 microns to 0.5 microns circuit linewidths with fifty to sixty percent (50%–60%) contrast at the image plane 25 with image plane distortion of less than 250 angstroms. The diameter of element 27 and obscuration 28 are approximately 4 inches, and 1.3 inches, respectively. The field of view of system 12 is approximately 1 cm², such that complete exposure of one level of a 4 inch IC wafer 26 requires one hundred (100) separate exposures, and can be completed in less than one (1) minute.

Figure 3B:
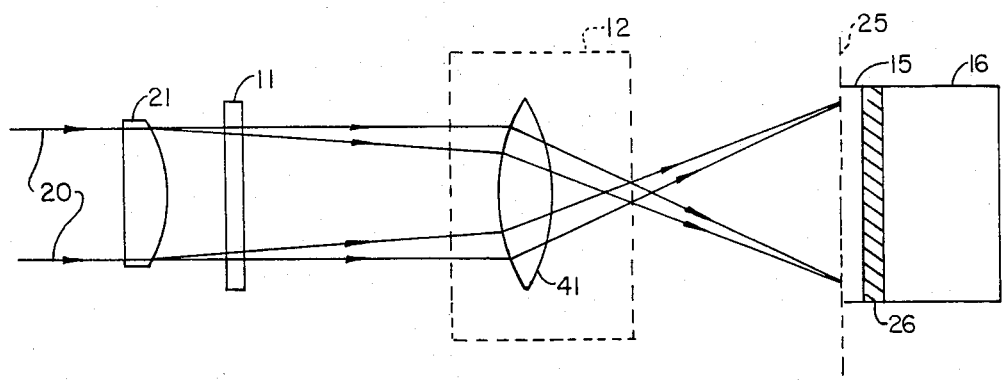

In an alternate embodiment, optical system 12 comprises a refractive optical system as shown in FIG. 3B. This system might comprise a double-Gauss lens design corrected for distortion, as well as other optical aberrations.

IC wafer 26 is a semiconductor substrate, for example, silicon, upon which successive layers of circuitry are built, typically, by the process of diffusion doping. It is noted that a basic process of lithographic construction of an IC is described in an article by L. Shepard and B. Carlson, entitled "Photo, E-Beam, and X-Ray Lithography", Scientific Honeyweller, Volume 1, No. 4, page 1, December, 1980. A layer of UV sensitive photoresist 15, such as Hunt WX-159 or Hitachi tri-level UV sensitive resist is applied to the substrate 26 by conventional techniques. The spectral sensitivity of the resist 15 is matched to the wavelength and power output of UV source 10.

The image of mask 11 is projected onto photoresist 15 of wafer 26 via optical projection system 12. To obtain the desired linewidth resolution (0.25 microns to 0.5 microns), the photoresist 15 must be located within the depth of focus, P, about the image plane 25 of the optical system 12, where $$P = \pm 0.4 L \left(\frac{2f}{d}\right)^2 ,$$

where L is the operating wavelength of the source of illumination, f is the focal length of the optical imaging system and d is the diameter of the optical imaging system. By way of example, a focal accuracy of approximately 500 angstroms, from the ideal image plane 25, is required. Because commercially available automatic focusing devices are only capable of focal accuracies on the order of ±0.25 microns, the subject invention uses one of these well-known devices as a coarse focus control 13, and may use a three-slit interferometric focus sensor as a second fine focus control 14.

Figure 1B:
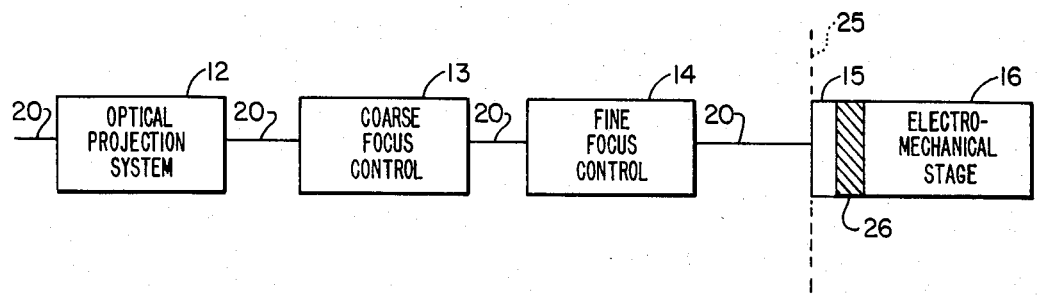

Coarse focus control 13 might utilize an indirect focus sensing mechanism such as a pneumatic device, or might function in conjunction with optical projection system 12 as in the case of a "through-the-lens" focus control mechanism, such as the intensity profiling device as shown in FIG. 1B. Through the lens focus control systems which require an illumination source may use the same source 10 which exposes the photoresist, or may use a separate monochromatic/laser source, which can be turned on when the UV source is off. A common source focus control system is described by H. E. Mayer and E. W. Loebach in "A New Step-by-Step Aligner For Very Large Scale Integration (VLSI) Production", SPIE, Volume 221, page 9 (1980). A separate source system is described by S. Wittekoek in "Step and Repeat Wafer Imaging", SPIE, Volume 221, page 2 (1980).

Figure 4A:
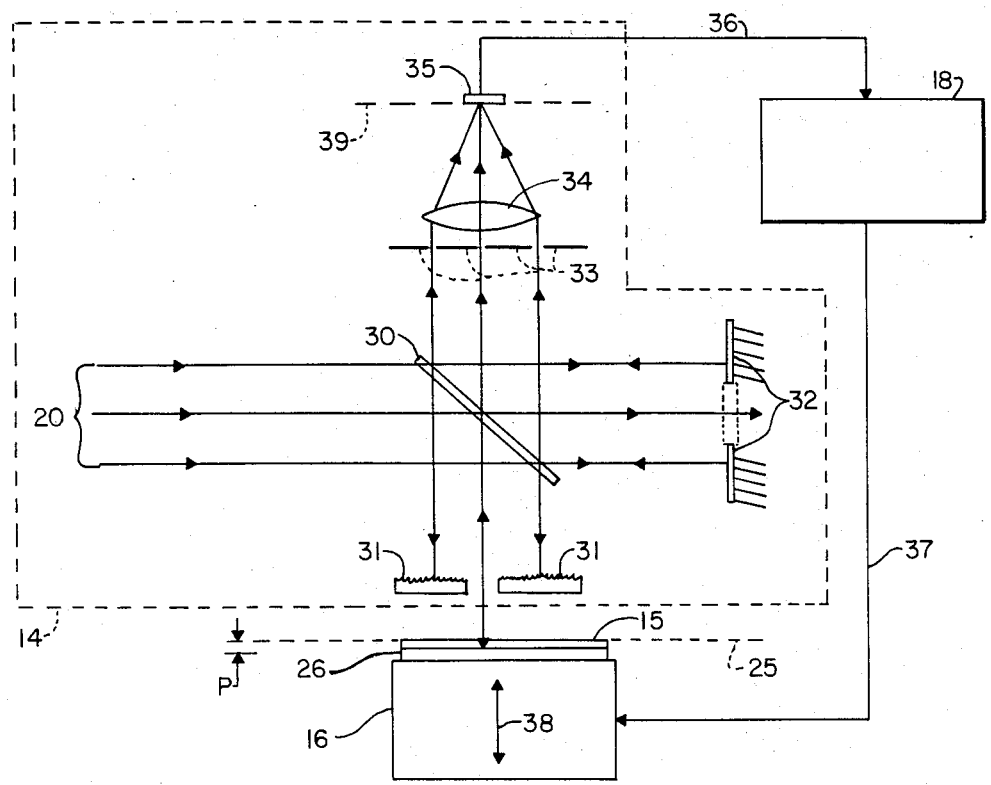
FIG. 4A shows a schematic of a three-slit interferometric focal sensor.

FIG. 4A shows the three-slit interferometric focus sensor 14. This device works on the principle of amplitude modulation rather than detection of fringe shifts, and is, therefore, more accurate than conventional interferometric positioning devices. Wafer 26 and mirror 32 with a central hole form the legs of a Michelson interferometer where the surface of mirror 32 and the plane of best focus 25 are an equal optical distance from beamsplitter 30.

Collimated laser beam 20 enters the device and is split by beamsplitter 30, as shown, so that it illuminates both wafer 26 and mirror 32. Light reflected off these two surfaces returns via beamsplitter 30 through lens 34 to photodetector 35. The mirror 32, baffles 31 and three-slit plate 33 are positioned so that the central slit passes light reflected off the surface of wafer 26, and the two outer slits pass light reflected off the reference surface of mirror 32. Lens 34 focuses all collected light onto photodetector 35. Electrical signal 36 from detector 35 is evaluated by electronic control system 18, which generates a feedback signal 37 to control the position of electromechanical stage 16 along axis 38.

Figure 4B:
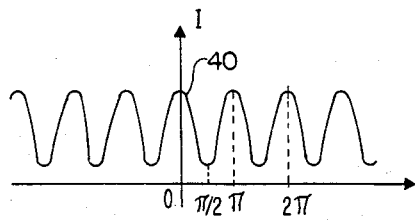
FIGS. 4B and 4C show the intensity distribution measured when the device is in and out of focus, respectively.
Figure 4C:
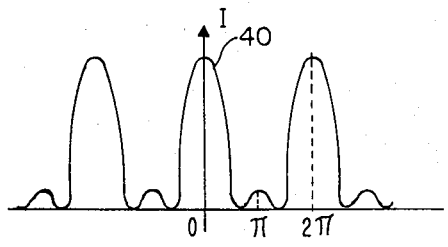

Best focus is obtained when stage 16 is moved such that photoresist 15 lies on plane 25 as shown. In this position the intensity distribution on detector plane 39 is shown in FIG. 4B. The size of detector 35 is selected so that the intensity of the central peak 40 can be measured. The system is in focus when the peak height is minimized as shown in 4B. The intensity differences which result when wafer 26 is moved from an out-of-focus position (shown in FIG. 4C) to an in-focus position (shown in FIGS. 4A and 4B) are calculated by electronic control system 18 to derive the feedback signal 37. Electronic control system 18 may comprise any well-known microprocessor or minicomputer system in combination with computer programs to control the alignment system, wafer and mask positioning, as well as the focus control device.

The alignment subsystem 17 comprises well-known laser interferometers, intensity profiling or image processing devices capable of maintaining system alignment to within 500 angstroms. Typical alignment and electromechanical wafer positioning devices are described in the article by Mayer and Loebach, cited above.

Having described the invention, what is claimed as new and novel and for which it is desired to secure Letters Patent is:

1. An optical lithographic system comprising:
   A. a first substrate;
   B. an ultraviolet source of illumination;
   C. a dynamic coherent optical condenser coupled to receive said illumination from said ultraviolet source, said condenser having a frequency cutoff typical of an incoherent optical condenser and which has high contrast and resolution typical of a coherent optical condenser;
   D. a mask including a desired image to be exposed on said first substrate;
   E. an ultraviolet sensitive photoresist layer on said first substrate whose sensitivity is substantially matched to that of said ultraviolet source of illumination;
   F. a reflective optical imaging system for imaging a representation of said mask onto said photoresist layer, said optical imaging system comprising a Cassagrain-type telescope design having a primary focusing mirror with a central obscuration, wherein the diameter of said obscuration is less than one-third the diameter of said primary focusing mirror; and
   G. means for focusing said representation of said mask produced by said optical system onto said photoresist layer to within a predetermined depth of focus.

2. A device as in claim 1 in which said ultraviolet source of illumination comprises an Excimer laser operating at a wavelength between 190 and 250 nanometers.

3. A system as in claim 1 in which said ultraviolet source of illumination comprises an arc lamp with one or more filters to provide a substantially coherent source of illumination at a mean wavelength between 190 and 250 namometers.

4. A system as in claim 1 wherein said optical imaging system images a reduced representation of said mask onto said photoresist layer.

5. A system as in claim 1 wherein said predetermined depth of focus is as follows:

$$P = \pm k \cdot L \left(\frac{2f}{d}\right)^2$$

where P is the depth of focus and where L is the operating wavelength of said source of illumination, f is the focal length of said optical imaging system, d is the diameter of said optical imaging system, and k is a constant.

6. A system as in claim 5 where the constant k is preferably about 0.4.

* * * * *